United States Patent [19]

Bernosky et al.

[11] Patent Number: 5,370,269

[45] Date of Patent: Dec. 6, 1994

[54] PROCESS AND APPARATUS FOR PRECISE VOLUMETRIC DILUTING/MIXING OF CHEMICALS

[75] Inventors: Eugene W. Bernosky, San Jose, Calif.; J. Tobin Geatz, Durham, N.C.; Edward T. Ferri, Jr., Gilroy; Glenn A. Roberson, Jr., Hollister, both of Calif.

[73] Assignee: Applied Chemical Solutions, Hollister, Calif.

[21] Appl. No.: 35,252

[22] Filed: Mar. 22, 1993

Related U.S. Application Data

[63] Continuation-in-part of Ser. No. 948,392, Sep. 21, 1992, Pat. No. 5,330,072, which is a continuation-in-part of Ser. No. 583,826, Sep. 17, 1990, Pat. No. 5,148,945.

[51] Int. Cl.$^5$ ................................................ B67D 5/08
[52] U.S. Cl. ........................................ 222/61; 222/64; 222/66; 222/135
[58] Field of Search .................. 222/1, 43, 56, 59, 61, 222/64, 66, 135, 145, 152, 309, 318, 399, 71; 137/205, 208, 209, 545

[56] References Cited

U.S. PATENT DOCUMENTS

| | | | |
|---|---|---|---|
| 1,460,389 | 7/1923 | Mauclere | 222/399 |
| 2,362,724 | 11/1944 | Shea | 222/59 |
| 3,370,755 | 2/1968 | Querner | 222/482 |
| 3,746,570 | 7/1973 | McIntosh | 222/152 |
| 3,804,297 | 4/1974 | Jurjans | 222/56 |
| 3,960,295 | 6/1976 | Horak | 222/145 |
| 4,019,528 | 4/1977 | Tyrrell | 137/209 |
| 4,106,671 | 8/1978 | Sharples | 222/61 |
| 4,204,612 | 5/1980 | Schrader et al. | 222/135 |
| 4,215,719 | 8/1980 | Laar et al. | 137/563 |
| 4,223,806 | 9/1980 | Buschmann | 222/64 |
| 4,380,248 | 4/1983 | Ambrus et al. | 137/428 |
| 4,524,801 | 6/1985 | Magnusco et al. | 222/56 |
| 4,580,699 | 4/1986 | Black et al. | 222/309 |
| 4,651,780 | 2/1987 | deVincenzo | 137/559 |
| 4,823,987 | 4/1989 | Switall | 222/64 |
| 5,012,955 | 5/1991 | Shannon | 222/61 |
| 5,145,092 | 9/1992 | Shannon | 222/152 |
| 5,148,945 | 9/1992 | Geatz | 222/61 |
| 5,242,468 | 9/1993 | Clark et al. | 29/25.01 |

FOREIGN PATENT DOCUMENTS

| | | | |
|---|---|---|---|
| 354665 | 12/1990 | European Pat. Off. | 222/318 |
| 7318826 | 12/1974 | France | 222/56 |
| 8203023 | 9/1982 | WIPO | 222/318 |

OTHER PUBLICATIONS

Chemfill-Chemical Delivery System-Brochure of FSI International, Chaska, MN, Feb. 1988.

"System Overview and Installation Planning" and Overview of Computerized Chemical Distribution Systems-Brochure of Systems Chemistry Inc., Milpitas, CA, May 1989.

"Unique Solutions to the Handling and Dispensing of Chemicals With a Commitment to Quality and Support"-Integrated Designs, Inc., Dallas, TX.

Advertising Brochure: "Total Control of High Purity Chemicals," Micro-Image Technology, Ltd. (Derbyshire, U.K.), (Aug. 1989).

Advertisement: "Total Control of High-Purity Chemicals," *European Semiconductor* (Jul. 1989).

*Primary Examiner*—Andres Kashnikow
*Assistant Examiner*—Kenneth Bomberg
*Attorney, Agent, or Firm*—John W. Logan, Jr. & Associates

[57] ABSTRACT

Apparatus and method for accurate measuring and mixing of chemicals is disclosed. The apparatus includes one or more metered vessels having a container of predetermined volume and at least one constricted vent tube therein. By mounting a sensor on the constricted vent tube, a greatly amplified measurement of the precise chemical volume in the metered vessel is provided. The apparatus and method of the present invention readily lends itself to a variety of applications and can be adapted to handle virtually any form of chemical mixing, diluting, or generating process.

24 Claims, 4 Drawing Sheets

PROCESS AND APPARATUS FOR PRECISE VOLUMETRIC DILUTING/MIXING OF CHEMICALS

The present application is a continuation-in-part of U.S. patent application Ser. No. 948,392, filed Sep. 21, 1992, issued as U.S. Pat. No. 5,330,072 which was a continuation-in-part of U.S. patent application Ser. No. 583,826, filed Sep. 17, 1990, and issued as U.S. Pat. No. 5,148,945 on Sep. 22, 1992.

BACKGROUND OF THE INVENTION

1. Field of the Invention

The present invention relates to apparatus and method for mixing/diluting, generating, and/or transferring of process chemicals. More particularly, the present invention provides improved process and apparatus for the precise mixing/diluting all forms of chemicals and, especially, ultra-high purity chemicals for use in a variety of industries, such as in the manufacture of semiconductor wafers and similar products.

2. Description of the Prior Art

The inventions of the parent applications are directed to process and apparatus for the transfer and delivery of high-purity chemicals from a bulk source to one or more end-use stations. As is explained therein, in many applications in industry today it is extremely important to maintain process chemicals free of virtually all contaminants. For instance, in the semiconductor industry the purity of chemicals, such as sulfuric acid, hydrogen peroxide, and ammonium hydroxide, used in semiconductor wafer production must be pure on level of approximately 25 (or fewer) particles per milliliter with a particle size of less than a fraction of a micron. As a result of these purity standards, many conventional methods of chemical transfer and delivery, such as paddled pumps and similar devices, have proven completely unsatisfactory.

Of further concern in these industries is that many of the chemicals employed are toxic, chemically aggressive, and/or require special conduit material, and must be carefully handled. In order to assure adequate purity and worker safety, it is extremely important that such chemicals be transferred, stored, and dispensed in a closed system, with minimal contact with the environment or workers.

Prior to the inventions of the parent applications, generally one of two methods were employed to effectuate high-purity chemical transfer. The first method is a "pumped delivery." In this method a positive displacement pump, usually an air powered double diaphragm type, is employed to provide both lift at a suction inlet from a bulk source of the chemicals and simultaneous pressure at the output to the end-user. The chemical is lifted from a chemical drum, driven through a pump, and pushed out to the point of use.

Although the pumped delivery system is widely employed, it is far from satisfactory. This system is capable of producing only minimal lift from the chemical bulk source—usually on the order of only a few pounds per square inch. Moreover, the system is replete with contamination problems: the rapidly expanding and Contracting of the pump diaphragm material (e.g. TEFLON®) causes mechanical degradation, with the degradation by-products (many of which being too small to filter with state-of-the-art filtration equipment) entering the chemical process stream; further, the rapid action of the pump (usually greater than 60 cycles per minute) creates massive impulses in the system with a resulting pulsed flow which forces particles through filters—thus rendering the filters far less effective. Finally, the mechanical shock and vibration inherent in this system creates constant maintenance problems, such as leaks.

The other system which is generally used addressed only some of these problems. In a "pump/pressure delivery" system, a positive displacement pump is again employed to provide lift from the bulk source of chemicals. However, the chemicals are delivered to an intermediate vessel from which inert gas pressure is used to motivate chemical to the use areas.

Although the pump/pressure system is better controlled and is more conducive to use of filters to assure chemical purity, it still has serious drawbacks in a submicron chemical environment. Again, lift provided by a double diaphragm pump is restricted. Further, such pumps are prone to degradation—with the by-products entering the chemical stream. Finally, the use of a single pressure vessel for delivery results in non-continuous delivery—constraining the volume of each delivery to "batch" sizes based on the size of the pressure vessel. If demand exceeds the volume of the pressure vessel, further delivery must be "queued" while the pump refills the pressure vessel. Alternatively, pressure from the pump that is equal to or greater than the pressure of the delivery vessel must be applied to the delivery vessel to supplement or refill it during demand; this further compounds filtration and maintenance problems.

The inventions disclosed in the parent applications solve all these problems. In those inventions, a combination of vacuum and pressure is used to transfer chemical smoothly from a bulk source, through one or more intermediate pressure/vacuum vessels ("PVV"), and to one or more end-use stations. First, a vacuum pump is used to establish a vacuum in one of the PVVs to draw chemicals into the PVV. Once a PVV is filled, the vessel is then pressurized to motivate chemical to an end-use station, to another PVV, or for recirculation back to the bulk source. The elimination of pumps from all chemical conduits in the system avoids the problems of degradation and contamination.

As is explained in the parent applications, the advantages of this improved transfer and delivery apparatus include: even (i.e. non-pulsed) flow through the system, reducing maintenance problems and allowing far more efficient use of filters; built-in redundancy to assure constant chemical supply and fail-safe operation; and electronic controls to monitor and maintain all aspects of system operation automatically.

In light of these substantial advantages of a vacuum/pressure transfer and delivery system, applicants believe that similar advantages can be achieved in a vacuum/pressure system for taking chemicals from multiple bulk sources and automatically mixing them (e.g. combining two or more process chemicals or diluting one or more process chemicals with water or other chemical) prior to delivery to the end-user.

Although liquid mixing systems are known, none addresses the contamination concerns of a high-purity environment. Most existing systems employ conventional fluid transfer means (e.g. pumps or water line pressure) to fill two or more metered vessels. From these vessels, the liquids to be mixed are then transferred, usually by pumps, to a mixing vessel and then to a storage facility or user. Examples of such existing systems are illustrated in U.S. Pat. Nos. 4,960,295, issued Jun. 1, 1976, to Horak, 4,019,528, issued Apr. 26, 1977, to Tyrrell, 4,215,719, issued Aug. 5, 1980, to Laar et al., and 4,823,987, issued Apr. 25, 1989, to Switall. None of these teaches means to assure that high purity chemicals will not be contaminated on a sub-micron level by the mixing apparatus itself.

Additionally, none of the existing mixing systems provides a simple yet effective method of accurately mixing chemicals in precise volumes. Although it is common to employ multiple metered vessels to measure the amount of each chemical to be mixed, with sensors typically used to cease the flow of liquid to the metered vessel once it is filled, none of these systems provides means to amplify the sensors' accuracy in order to assure very precise measurement of the volume of each vessel. The use of other metering methods, such as highly accurate flow meters or similar devices, may address some of these concerns, but are generally undesirable due to their expense, fragile nature, and/or possible contamination risks. As a result, none of the existing diluting/mixing systems is considered fully satisfactory in providing accurate mixing of high purity chemicals required by many industries.

Accordingly, it is a primary object of the present invention to provide improved apparatus and method for accurate mixing of chemicals from two or more bulk sources.

It is a further object of the present invention to provide an apparatus and method that includes, or readily interfaces with, means to transfer and deliver chemical from the bulk sources to end-use stations.

It is another object of the present invention to provide an apparatus and method that includes means to transfer and mix high-purity process chemicals from bulk sources and deliver them reliably and without contamination to end-use stations.

It is yet another object of the present invention to provide an apparatus and method that includes a simple and relatively inexpensive means to yield extremely precise volumetric measurement of chemicals.

It is an additional object of the present invention to provide an apparatus and method that employs a vacuum-pressure transfer and delivery system so as to generate even flow and negligible mechanical shock in the system.

These and other objects of the present invention will become evident from review of the following specification.

SUMMARY OF THE INVENTION

The present invention provides an improved apparatus and method for extremely accurate mixing of chemicals from two or more chemical bulk sources.

In operation the invention employs one or more metered vessels of predetermined volume in communication with the bulk source of chemical via an intake line and in communication with a downstream facility via a dispense line. Each of the metered vessels includes one or more constricted vent tubes therein. Chemical is transferred from each of the bulk sources to the metered vessel until a set capacity is attained. At that point, chemical flow proceeds up the vent tube until a sensor is reached. A valve is provided on the intake line to cease fluid flow to the metered vessel in response to a signal from the sensor.

By employing a constricted vent tube, the signal from the sensor can be greatly amplified to provide for more accurate filling of the metered vessel and more accurate mixing of chemicals. By including adjustable valve means on the intake lines and multiple sensors on the vent tubes, the rate of flow into the metered vessel can be carefully adjusted to provide extremely accurate chemical mixing proportions.

For improved motivation of chemicals through the apparatus of the present invention, a vacuum system and a pressure system are provided. Chemical can be smoothly drawn from the bulk source by decompressing (i.e. to a negative pressure) the metered vessel via the vacuum system. Once the metered vessel is filled, the metered vessel can then be pressurized using compressed gas in the pressure system to drive chemical through the dispense line to an intermediate or end-use station. The pressure system may also be used to perform other functions in the apparatus of the present invention, such as activating pneumatic valves or pressurizing sealed bulk sources and/or intermediate storage vessels to assist in motivation of chemical.

For many applications it is desirable to provide a separate mix tank where the measured proportions of chemicals can be thoroughly combined. As is disclosed, the mix tank may include a variety of means to improve the mixing process, such as heat exchange apparatus to adjust temperature of the chemicals or a gas sparger system or similar apparatus for producing turbulence to aid in the mixing process. This apparatus may also be included on the metered vessels themselves, which is particularly beneficial in instances where mixing of chemicals occurs in the metered vessels.

In addition to chemical mixing/diluting of virtually any form of chemical solution, the present invention encompasses other useful applications, such as serving as a chemical generator, or as a low-volume chemical transfer/dispense apparatus.

DESCRIPTION OF THE DRAWINGS

The operation of the present invention should become apparent from the following description when considered in conjunction with the accompanying drawings, in which.

DETAILED DESCRIPTION OF THE INVENTION

The present invention provides an improved apparatus and method for precisely mixing chemicals from two or more bulk sources and delivering the mixture to a variety of possible downstream destinations, including end use stations, intermediate storage vessels, and/or independent chemical transfer or dispense apparatus.

Figures 1, 1B:
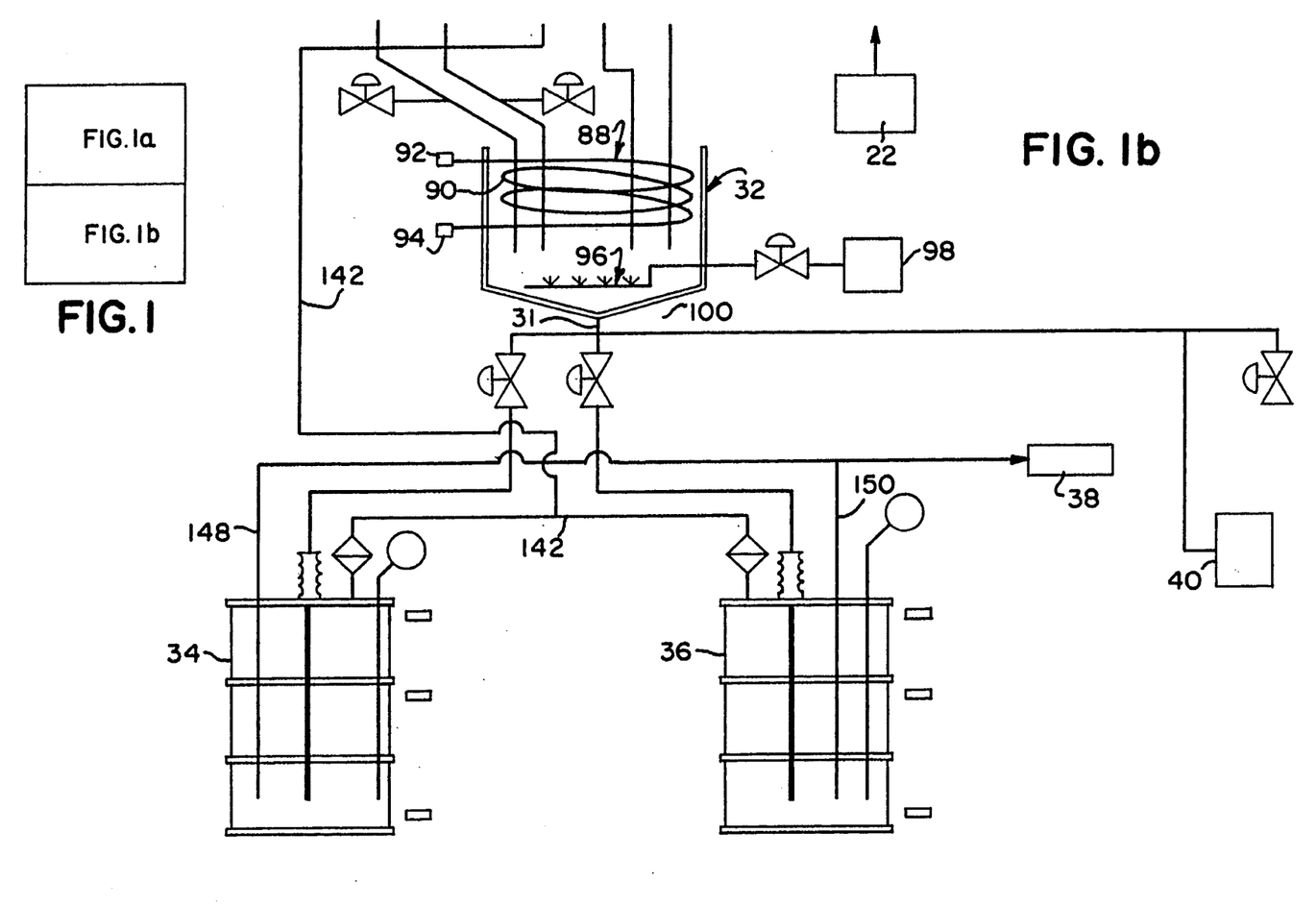
FIG. 1 is a schematic representation of the diluter/mixer apparatus of the present invention.
Figure 1A:
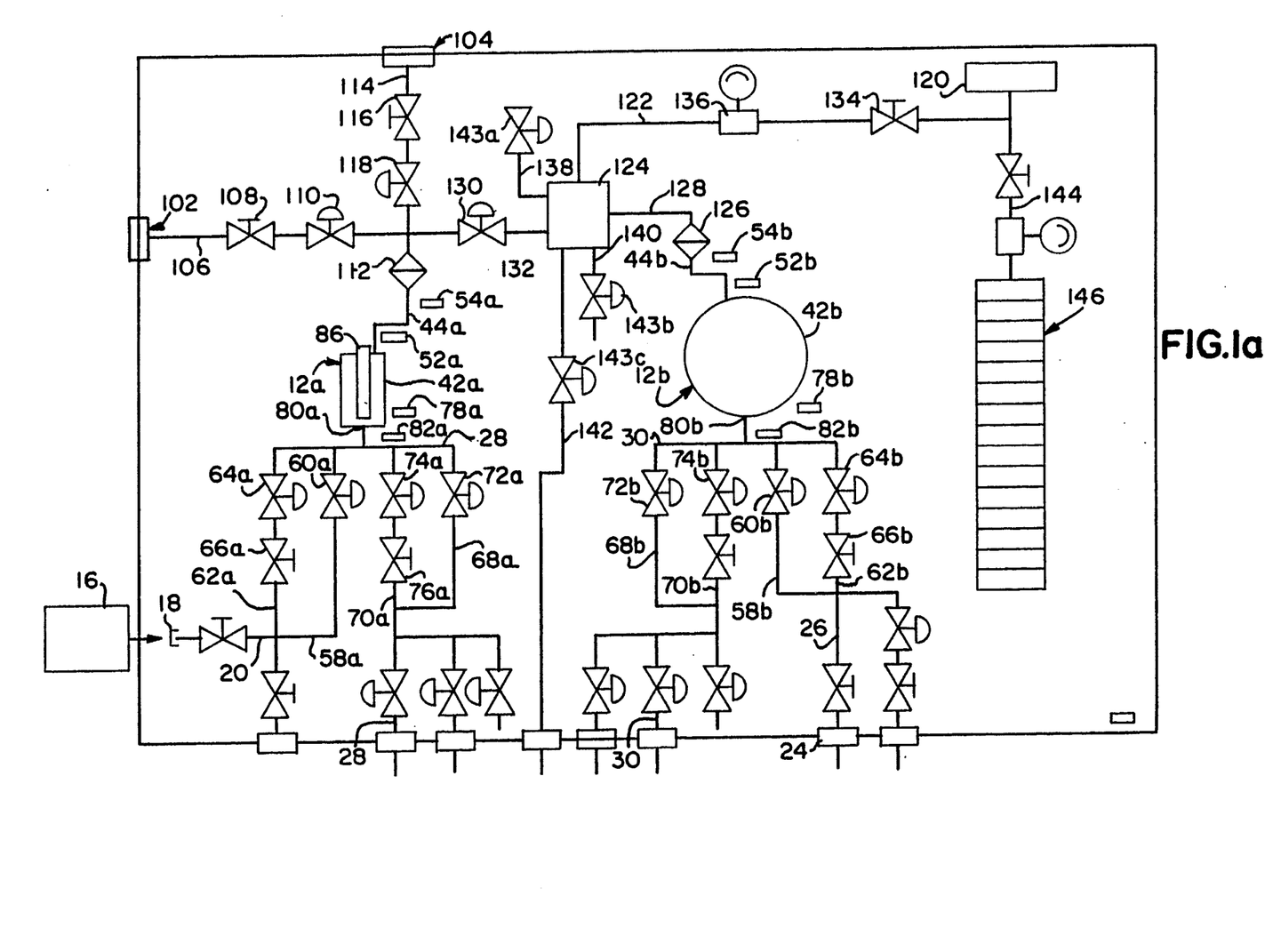

Illustrated in FIG. 1 is one embodiment of a diluter/mixer 10 of the present invention. The diluter/mixer 10 includes two metered vessels 12a, 12b. The first metered vessel 12a receives chemical from a bulk source 16 through a first chemical inlet 18 and a first intake line 20. The second metered vessel 12b receives chemical from a bulk source 22 through a second chemical inlet 24 and a second intake line 26.

In the embodiment shown, chemical exits each of the metered vessels 12a, 12b through a dispense line 28, 30 to a mix tank 32 where the chemicals are combined in the manner described below. Once mixing is completed, chemical can then be transferred through a continuation of the dispense line 31 to variety of destinations, such as: intermediate storage vessels 34, 36; chemical transfer/delivery apparatus 38, such as the apparatus disclosed in applicant's U.S. Pat. No. 5,148,945; or one or more point-of-use stations 40.

It should be understood that under certain conditions the mix tank 32 may be eliminated without diminishing the utility of the present invention. Examples of such circumstances are: where intermediate storage vessels or similar receptacles are employed and complete mixing of chemical can occur in the intermediate tanks themselves; and a single vessel diluter/mixer apparatus, such as that shown in FIG. 4 and described below, wherein mixing occurs in the metered vessel.

Figure 2:
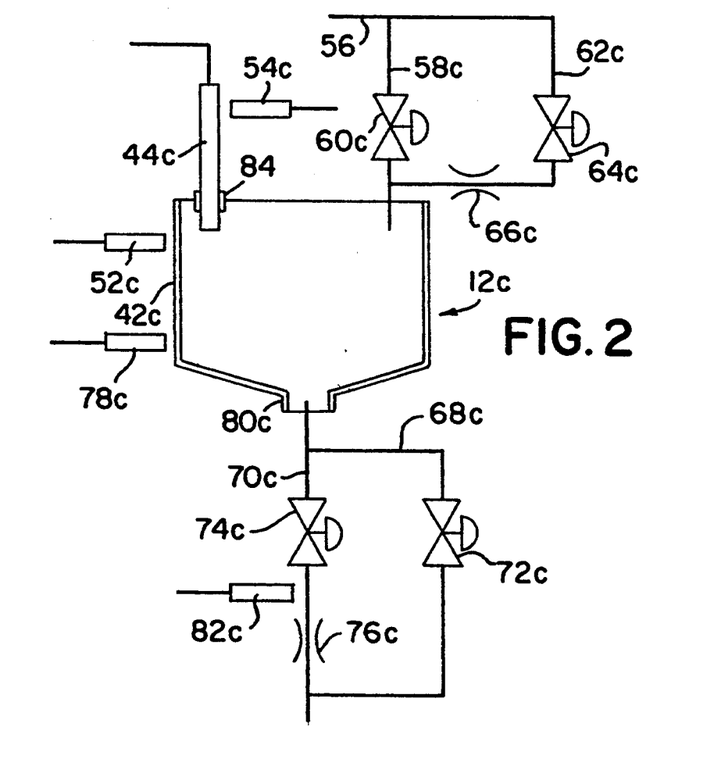
FIG. 2 is an enlarged schematic representation of one embodiment of a metered vessel of the present invention.

To accomplish extremely accurate mixing of chemicals, the metered vessels 12 of the present invention are provided with means to amplify the precise fluid level within the vessels as they approach filled capacity. As is shown in FIGS. 1 and 2, each of the metered vessels 12a, 12b, 12c of the present invention comprises a sealed main container 42a, 42b, 42c and a constricted vent tube 44a, 44b, 44c. Once the chemical content of the container 42 reaches the vent tube 44, the pressure of the trapped air in the top of the sealed container 42 will cause chemical to cease filling the container 42 and to begin filling only the tube 44. As is explained below, the greatly constricted capacity of the tube 44 provides a significantly amplified accuracy of measurement of chemical in the metered vessel and permits more accurate cessation of chemical flow into the vessel 12.

Figure 3:
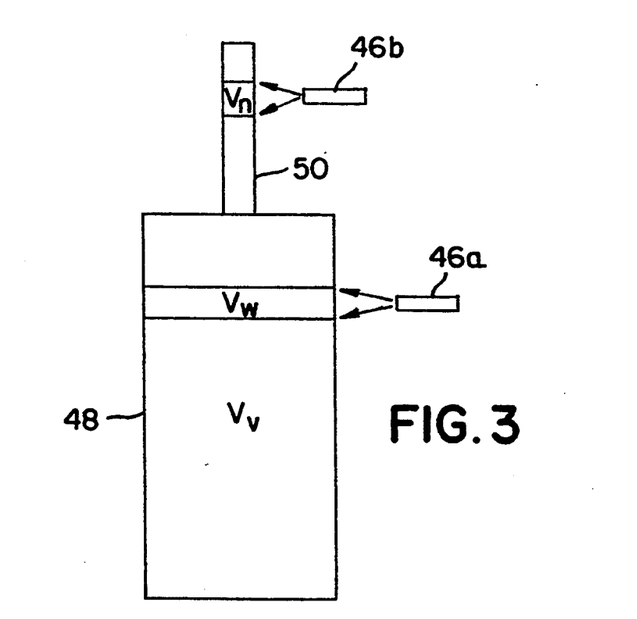
FIG. 3 is an enlarged schematic diagram illustrating the theory of operation of the constricted vent tubes of the present invention.

The theory of operation of the constricted vent tubes of the present invention can be better understood with reference to FIG. 3. As is illustrated, a reliable yet relatively low cost sensor 46a, 46b might have an effective "bandwidth" of about ⅛ inch. Mounting such a sensor on a container 48 having a volume of $V_v$, the range of error of the sensor 46a would comprise the volume $V_w$ (i.e. the volume occupied by a ⅛" of chemical across the entire diameter of container 48).

In contrast, by employing the same type of sensor 46b, with the exact same ⅛" bandwidth, on a vent tube 50, the range of error is greatly reduced. In this instance, the range of error is only the volume $V_n$ (i.e. the volume occupied by a ⅛" of chemical across the much smaller diameter of the vent tube 50). Since the volume $V_n$ is insignificant relative to the volume $V_v$, this simple modification of the metered vessel provides vastly improved accuracy to the process of filling the vessel without the need of introducing more expensive (and generally less reliable) sensors having narrower bandwidths.

To improve the accuracy of filling the metered vessels 12 further, in the preferred embodiments shown in FIGS. 1 and 2, two sensors 52, 54 are provided to monitor the presence of chemical in the metered vessels 42 and the vent tubes 44, respectively. The first sensor 52a, 52b, 52c (shown in FIG. 2 mounted on the container 42c near the level of the base of the vent tube 44c, and shown in FIG. 1 mounted on the vent tube 44a, 44b itself) provides a signal when chemical approaches or initially enters the vent tube 44a, 44b, 44c. The second sensor 54a, 54b, 54c is mounted on the vent tube 44a, 44b, 44c and provides a signal when chemical reaches the desired predetermined capacity of each vessel 12a, 12b, 12c. As is explained below, the use of the first sensor 52 allows intake fluid flow to be reduced to provide more time for accurate shut-off of chemical intake when the vessel 12 reaches capacity at the second sensor 54.

One method for reducing fluid flow comprises providing two intake paths from intake lines 20, 26, 56 to the metered vessels 12a, 12b, 12c,. Flow through the first intake path occurs through conduits 58a, 58b, 58c and is controlled by valves 60a, 60b, 60c. Flow through the second intake path occurs through conduits 62a, 62b, 62c and is controlled by both valves 64a, 64b, 64c and flow constrictions 66a, 66b, 66c. It should be noted that to avoid over-spray, needle-type or similar valves are preferred to control intake to the vessels 12.

This arrangement of valves can be coordinated to provide filling of the metered vessels 12 at maximum rate while assuring accurate shut-off at the predetermined volume. For initial filling of the metered vessels 12, both valves 60 and valve 64 are opened. In this orientation the vessels 12 will fill as rapidly as possible. Once the chemical level has reached the first sensors 52, valves 60 are closed and valves 64 are maintained opened, reducing the chemical flow via constrictions 66. In this manner the metered vessels 12 are slowly filled until sensors 54 are reached and valves 64 are closed. This method of operation assures quick yet extremely accurate filling of the vessels to the precise desired volume.

Of comparable importance to the accurate operation of the present invention is a mechanism for assuring that flow from the metered vessels 12 ceases at the same point in each cycle. To this end, dual output conduits 68a, 68b, 68c, and 70a, 70b, 70c are provided from each metered vessel 12a, 12b, 12c. Flow through the first output conduits is controlled by valves 72a, 72b, 72c. Flow through the second output conduits 70a, 70b, 70c is controlled by valves 74a, 74b, 74c and constrictions 76a, 76b, 76c. In order to monitor the presence of chemical in each of the conduits, a low sensor 78a, 78b, 78c is provided on either the container 42a, 42b, 42c itself or at its output port 80a, 80b, 80c; and a low-low sensor 82a, 82b, 82c is provided on one of the output conduits.

Similar to the operation of the intake system, in this instance the valves are coordinated to provide evacuation of the metered vessels 12 at maximum rate while assuring accurate shut-off once the predetermined volume has been discharged. For initial evacuation of the metered vessels 12, both valves 72 and valves 74 are opened. In this orientation the vessels 12 will empty at an optimum rate. Once the chemical level has reached the first low sensors 78, valves 72 are closed and valves 74 are left opened, reducing the chemical flow via constrictions 76. Thus flow from the metered vessels 12 is reduced until low-low sensors 82 are reached and valves 74 are closed. As was true with the filling process, this method of operation assures extremely accurate discharge of chemical from the vessels to the precise desired volume.

It should be understood that other effective methods of monitoring either intake or output flow may be substituted for the above apparatus without departing from the present invention. For instance, a single intake or output conduit and an adjustable valve may be used, with flow through the adjustable valve being reduced at the appropriate time in response to sensor signals.

It is preferred that the metered vessels 12 include means to modify the level of fluid each is adapted to contain. This allows for fine-adjustment of the relative quantity of each chemical to be mixed and also permits modification of the equipment to provide different mixing parameters. One such means is illustrated in FIG. 2.

In the volume adjustment means shown in FIG. 2, the constricted vent tube 44c is attached to the container 42c with an air-tight sliding connection 84, such as a compression fitting, permitting the tube 44c to be adjusted up or down within the container 42c while maintaining a sealed environment. So long as the air in the top of the container 42c cannot escape, once the chemical level reaches the bottom of the tube, the chemical will be forced up the tube in the way previously described. In this manner the "air pocket" in the top of the container is "leveraged" to provide an easily adjustable wide range of volumetric calibration while maintaining approximately the same level sensor locations and tank size.

A further or alternative method for adjusting the volume of the metered vessels 12 is illustrated in FIG. 1. In this embodiment the metered vessel 12a is fitted with a sliding adjustment rod 86 adapted to take up volume within the container 42a on a 1:1 basis (i.e. the rod 86 is calibrated to displace a set amount of volume of chemical (e.g. 1.0 cc) for each unit it is inserted into the container 42a). Accordingly, an operator can easily employ the adjustment rod 86 to adjust the final volume of the metered vessel, with the rod inserted or withdrawn the necessary amount to achieve the required volume.

In either instance, the metered vessel 12c can be readily calibrated to the correct volume by passing a pre-measured sample of chemical through it and adjusting the vent tube 44c and/or adjustment rod 86 accordingly. It should be understood that further adjustment may be achieved through a variety of other methods, such as providing a vertically moveable mounting for the sensors 52, 54 and/or sensors 76, 78.

As should be evident, the present invention provides means for easily and repeatedly mixing precise quantities of chemicals. Furthermore, the present invention readily lends itself to a variety of further refinements which improve its functionality.

In many instances it is desirable to provide a mix tank 32 where the chemicals can be combined and thoroughly blended. In the tank illustrated in FIG. 1, a temperature control system 88 is included which provides heat exchange coils 90 surrounding the tank container and having a heat exchange fluid inlet 92 and outlet 94. This heat exchange system allows an operator to increase or decrease the temperature of the chemicals during the blending process. For most common exothermic mixing reactions, a heat exchange fluid of cool water is satisfactory.

The mix tank 32 also may include a sparger system 96. The sparger 96 can be connected to a compressed inert gas source 98 (e.g. nitrogen) to provide effervescent agitation to aid in mixing, or can be connected to a heat source (e.g. steam) to aid in endothermic mixing reactions. Other mixing apparatus which may be used include mechanical paddle mechanisms, magnetic-driven stirring devices, vortex-generating apparatus, and similar implements. As is explained below, the sparger system 96 may also be employed as a chemical generator to mix reactive gaseous chemicals with the liquid chemicals from the metered vessels 12.

Finally, the mix tank 32 is provided with valving and conduits necessary to direct flow to the various chemical destinations 34, 36, 38, or 40. It is preferred to include a sensor 100 on the mix tank to provide information on when the tank has been completely evacuated.

Another useful option for the present invention is providing means to assist in motivating chemicals through the system. In many instances the apparatus of the present invention can be designed to use gravity feed and normal line pressures from bulk sources (e.g. municipal water supply pressure) to move chemicals through the apparatus. However, it is often desirable to provide additional means to assist in chemical movement, such as with pumps, vacuum and/or pressure.

As was disclosed in the parent applications, in many high purity chemical environments it is preferred to use a combination of vacuum and pressure to move liquid through a chemical dispense apparatus. Motivating chemicals through use of vacuum and pressure applied to sealed vessels avoids use of in-line pumps and similar devices which are subject to deterioration and resulting contamination of the chemical stream. Additionally, vacuum/pressure motivation avoids the pulsed flow of a pump—increasing the effectiveness of filters and reducing maintenance problems.

Shown in FIG. 1 are two examples of how vacuum and pressure can be used in conjunction with the metered vessels 12 of the present invention. Connected to the vent tube 44a of metered vessel 12a is a vacuum system 102, designed to decompress the metered vessel 12a to assist in drawing fluid into the vessel, and a pressure system 104, designed to pressurize the metered vessel 12a to assist in forcing fluid out of the vessel.

The decompression of the metered vessels 12a, 12b with the vacuum system 102 may be accomplished through the use of any known method. For most applications, adequate decompression can be established through use of one or more vacuum pumps, either directly attached to vacuum line 106 or attached to an intermediate vacuum vessel (not shown). Flow of gas through the vacuum line 106 is controlled by one or more valves 108, 110. In the embodiment shown, the vacuum line 106 is attached to the vent tube 44a in order to provide for decompression of metered vessel 12a and draw of chemical up to the level of sensor 54a. One or more filter units or traps 112 may be provided to protect from contamination of chemical in the metered vessel 12a and/or to avoid over-draw of chemical past sensor 54a into the vacuum system.

By employing a vacuum system 102 to decompress a metered vessel 12, chemical can be easily and smoothly drawn from the bulk source into the metered vessel 12. This method of filling the metered vessel avoids the use of diaphragm pumps and similar devices which are apt to contaminate the chemical stream through degradation. Moreover, a vacuum draw of chemical can be accomplished with an extremely uniform flow rate—avoiding pump-induced "pulsed" flow and the maintenance problems it often causes (e.g. leaks caused by separating fluid lines, damage to chemical suspensions, and contamination caused by driving unwanted impurities through filters).

Once chemical is drawn into the metered vessel 12a, the speed of its evacuation can be greatly improved through use of the pressure system 104. In this instance, a pressurized gas source, such as a tank of compressed nitrogen, provides gas over pressurized gas line 114.

Flow through the gas line 114 is controlled by valves 116, 118.

When the metered vessel 12a is filled to its appropriate level, the vessel can then be pressurized via a connection between the pressurized gas line 114 and the vent tube 44a. Once the metered vessel 12a is pressurized, chemical can then be driven from the vessel along the flow paths already discussed. Again, by avoiding use of pumps or similar devices, chemical can be driven from the metered vessel 12 at a uniform flow rate and without the problems inherent in a pump-driven system.

The second metered vessel 12b is arranged to accomplish the motivation of chemical in a number of suitable manners. First, the basic system as illustrated relies simply on the line pressure from bulk source 22 to fill the metered vessel 12b. For most applications, evacuation of the metered vessel 12b along the dispense lines can be accomplished merely by orienting the metered vessel 12b sufficiently above the down-stream facilities to allow gravity to empty the vessel.

An alternative pressurized gas system 120 is also shown in FIG. 1 which can also be utilized to provide motivation of chemical from the second metered vessel 12b for certain applications. In this form, pressurized gas is directed to the metered vessel 12b via a pressurized gas line 122 and a zero pressure box 124. Vent tube 44b is likewise connected to the zero pressure box 124 through filter 126 and conduit 128. The zero pressure box 124 is also connected to the vacuum system 102 via valve 130 and conduit 132.

The zero pressure box 124 of the present invention provides a buffer or vent area to control pressure and vacuum release from either metered vessel 12a or 12b and/or intermediate vessels 34, 36. This area is considered to be particularly desirable in providing a safe venue for the release of ultra-pure, pressurized nitrogen and similar gases from the system, and to provide a means for intake of filtered air into vessels 12a, 12b, 34 or 36 to equalize vacuum pressures without contamination of the system.

To accomplish these goals, the zero pressure box 124 receives pressurized gas from gas system 120 through gas line 122, valve 134, and pressure regulator/pressure gauge 136. The zero pressure box 124 also has a conduit 138 leading to an exhaust vent, a drain conduit 140 leading to a plenum drain, and an additional conduit 142 in communication with each of the intermediate storage vessels 34, 36. In order to seal the zero pressure box 124 at appropriate times, each of conduits 138, 140, 142 may be provided with isolation valves 143a, 143b, 143c, respectively.

Arranged in this manner, both vacuum and pressure can be provided to the metered vessel 12b for suitable motivation of chemical. Additionally, the zero pressure box serves as a buffer to protect both the vacuum and the pressure systems from contamination in the case of excess draw of chemical through conduit 128.

The alternative pressure system 120 may also be designed to supply pressurized gas to other components in the present invention (e.g. as compressed gas source 98). As illustrated, a second pressurized gas conduit 144 is provided to supply pressure to a rack of solenoids 146. These may used as a pressurized gas source for operation of pneumatic valves, such as the valves employed throughout the system of the present invention.

The pressurization of the intermediate vessels 34, 36 via conduit 142 provides a convenient means to assist in the delivery of chemical from the vessels 34, 36 when needed. By hermetically sealing the vessels 34, 36 and providing pressure from pressure system 120, chemical can be motivated from the vessels under pressure through conduits 148 and 150. As should be evident from the above discussion, this arrangement yields a smooth, non-pulsed transfer of chemical from the intermediate vessels.

Figure 4:
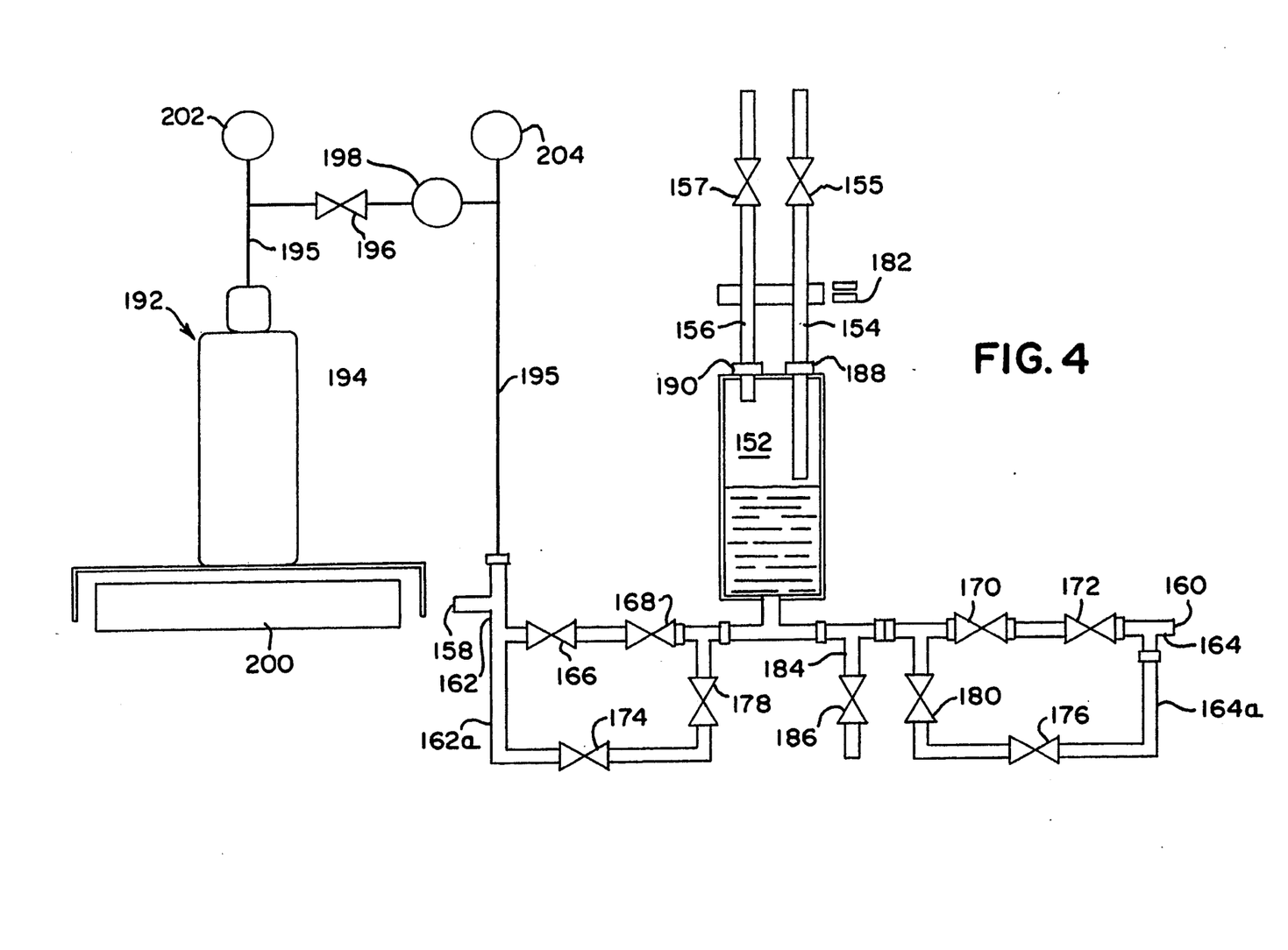
FIG. 4 is a schematic representation of another embodiment of the diluter/mixer apparatus of the present invention.

An alternative embodiment of the diluter/mixer of the present invention is illustrated in FIG. 4. In this form, only a single metered vessel 152 is used for combination of chemicals from two or more sources. Multiple vent tubes 154, 156 are included in the metered vessel 152, each corresponding with one of the chemical sources and each oriented at a different height. To control the flow of fluid through the vent tubes 154, 156, each is provided with a valve 155, 157, respectively.

Chemical is supplied to the metered vessel 152 from two or more chemical inlets 158, 160 along intake lines 162, 164. Each of the intake lines 162, 164 can be attached to the metered vessel 152 via separate connections, or by a single junction 166, as shown. Each of the intake lines 162, 164 is provided with valves 166, 168, 170, 172 to control the flow of chemical therethrough. Additionally, alternative flow paths may be provided via intake lines 162a, 164a to deliver chemical at a reduced flow rate through valves 174, 176 and adjustable constrictions 178, 180.

In operation, chemical is delivered to the metered vessel 152 from a first chemical source along a first intake line 162 until vent tube 154 is reached. By operating with vent tube valve 155 open and vent tube valve 157 closed, once vent tube 154 is reached the chemical flow will proceed up the vent tube 154 until sensor 182 is attained. Chemical flow is then shut off from the first intake line 162. At this stage, valve 157 is opened and valve 155 is closed (allowing chemical to drain from vent tube 154 into the metered vessel 152).

Chemical is next delivered to the metered vessel 152 from a second chemical source along second intake line 164 until vent tube 156 is reached. Again, chemical flow will proceed up vent tube 156 until chemical flow is ceased when sensor 182 is reached. It should be noted that to assist in minute adjustments of the amount of each chemical component, it may be desirable to provide a separate sensor on each of the vent tubes, each being independently vertically adjustable. Once the vessel 152 is filled and the chemicals have been thoroughly mixed, the blended chemical can then be discharged to any desired location via dispense line 184 and valve 186 motivated by any suitable means, including gravity or pressure.

In this manner the precise volume of each chemical can be supplied to, and mixed in, the single metered vessel. Arranged in this way, the size and cost of the entire system is significantly reduced, eliminating multiple metered vessels as well as the mix tank.

It should be appreciated that this embodiment may be readily modified to provide any of the desirable options already discussed. For instance, the metered vessel 152 may be provided with heat exchange coils and/or a sparger system to provide the cooling/heating and mixing options available on the mix tank 32. Another useful modification is to provide two levels of sensors 182 to register near-filled conditions and provide for flow reduction (via constricted intake lines 162a, 164a) and precise flow cut-off in the manner already discussed. Further, the various methods previously discussed for adjusting final fluid volume, such as slidable compression fittings 188, 190, can also be provided. Similarly, this system also can be adapted to the various methods discussed for motivating chemicals through the system (e.g. vacuum and pressure).

Another option with this embodiment is that it easily lends itself to combining chemicals from many different sources. As should be evident, many different chemicals can be mixed using this method by simply adding an additional vent tube at a different level for each chemical to be included and connecting to additional chemical inlets.

Another option shown in the embodiment of FIG. 4 is to employ this apparatus for a chemical generator. As is known, it is often desirable to provide for the combination of liquid (non-compressible fluid) and gas (compressible fluid) to generate a desired chemical. For instance, combination of ultra-pure water ($H_2O$) with anhydrous ammonia ($NH_3$) gas produces ammonium hydroxide ($NH_3OH$); combination of water with HF gas produces aqueous HF; combination of water with chlorine gas produces aqueous HCl. All of these end products are common chemicals used in the semiconductor industry.

As illustrated, such chemical generation is accomplished by using a gas system 192 in communication with one of the intake lines 162. Gas is supplied from a gas storage tank 194 through gas line 195 to intake line 162. Flow through the gas line 195 is controlled by valve 196 and pressure regulator 198. To monitor the presence and amount of gas in the gas system 192, a scale 200 may be provided to track the weight of the tank 194 and various pressure gauges 202, 204 can be provided on the gas line.

To act as a chemical generator, the metered vessel 152 is first filled to the desired level with the liquid chemical component(s), using vent tube 154 to monitor and shut off flow at the appropriate level in the manner already described. At this point, the gaseous chemical component is supplied to the metered vessel 152, bubbling through the liquid chemical components. The reaction between gaseous and liquid chemical components results in an increase in the liquid chemical volume until vent tube 156 is filled and flow of gaseous chemical is shut off via valve 166 and/or valve 196.

As should be evident from this discussion, any number of either liquid or gaseous chemical components may be combined in this manner for mixing of chemicals and/or chemical generation.

It should be understood that the particular types of metered vessels used with the present invention may be application specific and that different types of vessels may be readily substituted depending upon need. For instance, the apparatus illustrated in FIG. 1 is designed primarily for the dilution of an acid or alkaline (e.g. $NH_4OH$) from the first metered vessel 12 with a larger quantity of deionized water or similar diluent chemical from the second metered vessel 12b. By providing a first metered vessel 12 with a tank capacity of approximately 6 liters and a second metered vessel 12b with a tank capacity of approximately 50 liters, most common dilutions can be readily handled in this context.

It should be likewise understood that the use of the term "chemical" herein is intended to cover any chemical element or composition, including gaseous, liquid and solid suspensions, which can be handled by the apparatus of the present invention, including water. Accordingly, the use of the terms "mixing" and "diluting" are intended to be used interchangeably to describe the combination of chemicals from different sources.

It should be further appreciated that the present invention has numerous other applications beyond those specifically discussed above. For instance, for low volume applications the present invention as disclosed in FIG. 1 can be used in the manner described in the parent applications as a chemical transfer/dispense apparatus. Similarly, in addition to combining, mixing, and delivering high purity chemicals, the apparatus of the present invention is also quite adaptable for use in other chemical mixing applications, such as combining or diluting suspensions of microorganisms or similar scientific or industrial material. Additionally, the present invention also can be used to accomplish extremely high-purity, smooth filtering of various chemical components, especially when employing the vacuum and/or pressure motivation systems described.

While particular embodiments of the present invention have been illustrated and described herein, the present invention should not be limited to such illustrations and description. It should be apparent that changes and modifications may be incorporated and embodied as part of the present invention within the scope of the following claims.

What is claimed is:

1. Apparatus for accurately mixing chemicals from two or more bulk sources which comprises:
   a first intake line providing fluid communication of chemical between a first bulk source and a first metered vessel;
   a second intake line providing fluid communication of chemical between a second bulk source and a second metered vessel;
   a dispense line providing fluid communication between each of the meter vessels and a down-stream facility;
   wherein each of the metered vessels comprises: a container of predetermined volume; at least one constricted fill tube, which constricted tube is filled once the container has been filled to a set level; and at least two sensors, a first sensor detecting when the vessel is nearly filled with chemical and a second sensor detecting when the vessel is completely filled with chemical;
   wherein at least the second sensor is mounted on the constricted fill tube so as to provide amplified chemical fluid level information to the second sensor; and
   wherein fluid flow into each of the metered vessels is controlled in response to signals from the sensors, an adjustable valve included on each of the intake lines responding to signals from the sensors, the valve adjusting the rate of chemical flow into the metered vessel so as to restrict chemical intake after chemical level has reached the first sensor and to cease chemical intake after chemical level has reached the second sensor, assuring precise cessation of chemical flow into the metered vessels at a predetermined volume.

2. The apparatus of claim 1 wherein a further sensor is provided on the vent tube to cease chemical flow if chemical overfills the vent tube.

3. The apparatus of claim 1 which further comprises a mix tank on the dispense line to provide for mixing of the chemicals from each of the meter vessels prior to delivery to the down-stream facility.

4. The apparatus of claim 3 wherein the mix tank is provided with means to regulate the temperature of the chemicals in the tank.

5. The apparatus of claim 4 wherein the means to regulate the temperature of the chemicals comprises heat exchange coils surrounding the mix tank.

6. The apparatus of claim 1 which further comprises a pressurized gas system in communication with the metered vessels to motivate chemical from the metered vessel to the down-stream facility.

7. The apparatus of claim 1 wherein the down-stream facility comprises at least one storage container.

8. The apparatus of claim 3 wherein the down-stream facility comprises at least one end-use station.

9. The apparatus of claim 1 wherein the two sensors are mounted on the fill tube, the first sensor, indicating when chemical has initially entered the fill tube, and the second sensor, indicating when the fill tube is filled with chemical.

10. The apparatus of claim 9 wherein precision volume adjustment apparatus is provided on each of the metered vessels to assist in calibrating the exact volume of the vessels.

11. The apparatus of claim 10 wherein the precision volume adjustment apparatus comprises a positive displacement element slidably connected to the metered vessel to modify the available liquid volume within the vessel.

12. The apparatus of claim 10 wherein the precision volume adjustment apparatus comprises the constricted vent tube mounted in sliding relationship with the container to control the level at which chemical begins to enter the vent tube.

13. The apparatus of claim 9 wherein the metered vessel includes a low-level sensor to indicate when the metered vessel has been evacuated of chemical.

14. The apparatus of claim 1 wherein the adjustable valve comprises
multiple flow paths, with a separate valve element controlling chemical flow through each of the flow paths; and
wherein one of the flow paths is constricted so as to limit the rate of chemical flow therethrough.

15. The apparatus of claim 1 which further comprises
a vacuum system in communication with at least one of the metered vessels;
a pressure system in communication with at least one of the metered vessels;
wherein chemical is drawn into the metered vessel by establishing a negative pressure in the vessel through use of the vacuum system, and chemical is dispensed from the metered vessel by applying pressure to the vessel through use of the pressure system.

16. The apparatus of claim 15 wherein a zero pressure box is provided in communication with the metered vessel to provide an area for safe venting of vacuum and pressure from the metered vessel.

17. Apparatus for accurately measuring and combining chemicals which comprises:
at least one metered vessel in fluid communication with at least one bulk source of chemicals, by at least one intake line the metered vessel comprising:
a container of predetermined volume; at least one constricted vent tube, which constricted vent tube is filled once the container has been filled to a set level; and at least two sensors, a first sensor detecting when the vessel is nearly filled with chemical and a second sensor detecting when the vessel is completely filled with chemical;
a dispense line providing fluid communication between the metered vessel and a down-stream facility;
wherein at least the second sensor is mounted on the constricted vent tube so as to provide amplified chemical fluid level information to the second sensor; and
wherein fluid flow into the metered vessel is controlled in response to signals from the sensors, an adjustable valve included on said at least one intake line responding to signals from the sensors, the valve adjusting the rate of chemical flow into the metered vessel so as to restrict chemical intake after chemical level has reached the first sensor and to cease chemical intake after chemical level has reached the second sensor, assuring precise cessation of chemical flow into the metered vessel at a predetermined volume.

18. The apparatus of claim 17 wherein the down-stream facility comprises a mix tank.

19. The apparatus of claim 17 wherein
the metered vessel includes multiple constricted vent tubes and at least two sensors associated with each constricted vent tube, each constricted vent tube set at a different height within the vessel;
the metered vessel is in fluid communication with multiple bulk sources of chemicals via multiple corresponding intake lines, the flow from each of the bulk sources being monitored by one of the constricted vent tubes and its associated sensors; and
wherein fluid flow into the metered vessel from each of the bulk sources is controlled in response to signals from the associated sensors on the constricted vent tube corresponding to the bulk source, the adjustable valve included on each of the corresponding intake lines responding to signals from the sensors, the valve adjusting the rate of chemical flow into the metered vessel so as to restrict chemical intake after chemical level has reached the first sensor and to cease chemical intake after chemical level has reached the second sensor, assuring precise cessation of chemical flow into the metered vessel at a predetermined volume.

20. The apparatus of claim 1 wherein the mix tank includes means to regulate the temperature of the chemicals in the tank, including heat exchange coils.

21. The apparatus of claim 17 wherein the two sensors are mounted on the vent tube, the first sensor, indicating when chemical has initially entered the vent tube, and the second sensor, indicating when the vent tube is filled with chemical.

22. The apparatus of claim 17 wherein the constricted vent tube is mounted in sliding relationship with the container to control the level at which chemical begins to enter the vent tube so as to provide precision volume adjustment of the vessel.

23. The apparatus of claim 17 wherein the metered vessel includes a low-level sensor to indicate when the metered vessel has been evacuated of chemical.

24. The apparatus of claim 17 wherein the adjustable valve comprises:
multiple flow paths, with a separate valve element controlling chemical flow through each of the flow paths; and
wherein one of the flow paths is restricted so as to limit the rate of chemical flow therethrough.

* * * * *

UNITED STATES PATENT AND TRADEMARK OFFICE
CERTIFICATE OF CORRECTION

PATENT NO. : 5,370,269
DATED : Dec. 6, 1994
INVENTOR(S) : Eugene W. Bernosky et al.

It is certified that error appears in the above-identified patent and that said Letters Patent is hereby corrected as shown below:

In Claim 9, col. 13, line 16 - After "sensor" delete the comma.

In Claim 9, col. 13, line 18 - After "sensor" delete the comma.

In Claim 21, col. 14, line 50 - After "sensor" delete the comma.

In Claim 21, col. 14, line 52 - After "sensor" delete the comma.

Signed and Sealed this

Twenty-eight Day of February, 1995

*Attest:*

BRUCE LEHMAN

*Attesting Officer*     *Commissioner of Patents and Trademarks*